(12) United States Patent
Mayfield et al.

(10) Patent No.: US 11,570,894 B2
(45) Date of Patent: Jan. 31, 2023

(54) THROUGH-HOLE AND SURFACE MOUNT PRINTED CIRCUIT CARD CONNECTIONS FOR IMPROVED POWER COMPONENT SOLDERING

(71) Applicant: Rockwell Collins, Inc., Cedar Rapids, IA (US)

(72) Inventors: James B. Mayfield, Cedar Rapids, IA (US); Robert P. Campbell, Marion, IA (US); Jeffrey J. Deloy, Central City, IA (US); John A. Bauer, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/319,479

(22) Filed: May 13, 2021

(65) Prior Publication Data

US 2021/0360789 A1    Nov. 18, 2021

Related U.S. Application Data

(60) Provisional application No. 63/025,757, filed on May 15, 2020.

(51) Int. Cl.
*H05K 1/11* (2006.01)
*H05K 1/02* (2006.01)

(52) U.S. Cl.
CPC .......... *H05K 1/116* (2013.01); *H05K 1/0298* (2013.01); *H05K 2201/062* (2013.01); *H05K 2201/09609* (2013.01); *H05K 2201/1031* (2013.01); *H05K 2201/10303* (2013.01)

(58) Field of Classification Search
CPC ......... H05K 1/116; H05K 2201/09718; H05K 2201/062; H05K 2201/09609; H05K 2201/10303; H05K 3/3421; H05K 3/3447; H05K 2201/0979; H05K 1/115; H05K 1/0206; H05K 1/0298
See application file for complete search history.

(56) References Cited

U.S. PATENT DOCUMENTS

| | | | |
|---|---|---|---|
| 6,362,438 | B1 | 3/2002 | Chong et al. |
| 7,656,031 | B2 | 2/2010 | Chen et al. |
| 9,418,965 | B1 | 8/2016 | Li et al. |
| 9,942,985 | B2 | 4/2018 | Shin et al. |
| 2004/0238211 | A1 | 12/2004 | Momokawa et al. |

(Continued)

FOREIGN PATENT DOCUMENTS

GB    2405533 A    3/2005

OTHER PUBLICATIONS

Extended Search Report for European Application No. 21174177.2 dated Oct. 20, 2021, 10 pages.

*Primary Examiner* — Steven T Sawyer
(74) *Attorney, Agent, or Firm* — Suiter Swantz pc llo

(57) ABSTRACT

A system of circuit card components each include through-holes for soldering having recessed copper layers for thermal insulation. Thermal insulation prevents heat conduction away from flowing solder, allowing the solder to flow freely through the through-hole. Even high-temperature, lead-free solders may maintain the necessary temperature to flow. Different circuit layers include specialized features based on distance from a top or bottom surface. Vias surrounding the through-hole maintain the necessary cross-sectional area for electrical connectivity.

9 Claims, 8 Drawing Sheets

(56) References Cited

U.S. PATENT DOCUMENTS

| | | | |
|---|---|---|---|
| 2007/0017693 A1* | 1/2007 | Bois | H05K 1/0242 |
| | | | 174/250 |
| 2007/0080465 A1* | 4/2007 | Ebukuro | H05K 1/116 |
| | | | 257/774 |
| 2007/0217168 A1 | 9/2007 | Masuyama et al. | |
| 2008/0121422 A1 | 5/2008 | Karasawa et al. | |
| 2008/0223611 A1 | 9/2008 | Ashida | |
| 2011/0024177 A1 | 2/2011 | Wong et al. | |
| 2011/0061233 A1* | 3/2011 | Martinez-Vargas | H05K 1/116 |
| | | | 29/829 |
| 2011/0094788 A1 | 4/2011 | Chen et al. | |
| 2013/0016480 A1* | 1/2013 | Sun | H05K 3/3421 |
| | | | 29/829 |
| 2014/0077896 A1* | 3/2014 | Lee | H03H 7/17 |
| | | | 333/185 |
| 2019/0132952 A1 | 5/2019 | Oka et al. | |
| 2020/0029471 A1* | 1/2020 | Sugiura | H05K 1/0206 |
| 2020/0281069 A1* | 9/2020 | Katada | H05K 1/181 |

\* cited by examiner

THROUGH-HOLE AND SURFACE MOUNT PRINTED CIRCUIT CARD CONNECTIONS FOR IMPROVED POWER COMPONENT SOLDERING

PRIORITY

The present application claims the benefit under 35 U.S.C. § 119(e) of U.S. Provisional App. No. 63/025,757 (filed May 15, 2020), which is incorporated herein by reference.

BACKGROUND

Large through-hole or surface mount leaded components typically utilized in power supply technology such as transformers and inductors are difficult to solder or re-work in a factory environment.

Such components often require additional solder processing steps such as pre-heating; they can lack appropriate solder fill as defined in industry acceptance standards to meet electrical and mechanical performance characteristics; and re-work is difficult or impossible without excess scrap due to circuit card copper content, laminate stack-up, and internal circuit card layer solder connections. Furthermore, higher soldering temperatures leads to integrity issues at the plated through-hole, delamination, decomposition, and layer separation. Copper dissolution may result from extended soldering times.

These components require specialized soldering equipment such as specialty irons and soldering tips, selective solder machines, solder pots, hot-plates/pre-heaters, etc. Furthermore, lead-free solder alloys with higher melting points than traditional tin-lead solders create further difficulties maintaining the high temperatures necessary to get the solder to flow into the plated through-holes or onto the surface mount conductor surfaces. Rework/repair of these devices becomes almost an impossible task. These issues will become more pronounced as the industry trends toward higher power density and lead-free materials.

High temperatures and long soldering dwell times lead to an increased risk of PCB integrity issues affecting long term reliability. PCB material defects such as laminate delamination, thermal decomposition, pad lifting, inner layer separation and copper dissolution are all possible outcomes if the soldering process is not controlled.

SUMMARY

In one aspect, embodiments of the inventive concepts disclosed herein are directed to a system of circuit card components with through-hole electrical connections for soldering having recessed copper layers for thermal insulation. Thermal insulation prevents heat conduction away from flowing solder, allowing the solder to flow freely through the through-hole and around the pin to be soldered. Even high-temperature, lead-free solders may maintain the necessary temperature to flow more efficiently. Different circuit layers include specialized features based on distance from a top or bottom surface and the specific plane layers (ground, power).

In a further aspect, vias surrounding the through-hole maintain the necessary cross-sectional area for electrical connectivity.

The embodiments of the inventive concepts disclosed apply to both axial as well as surface mounted devices. Surface mount devices oftentimes contain many vias within the surface mount pad pattern that also cause heat to flow from the solder joint.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
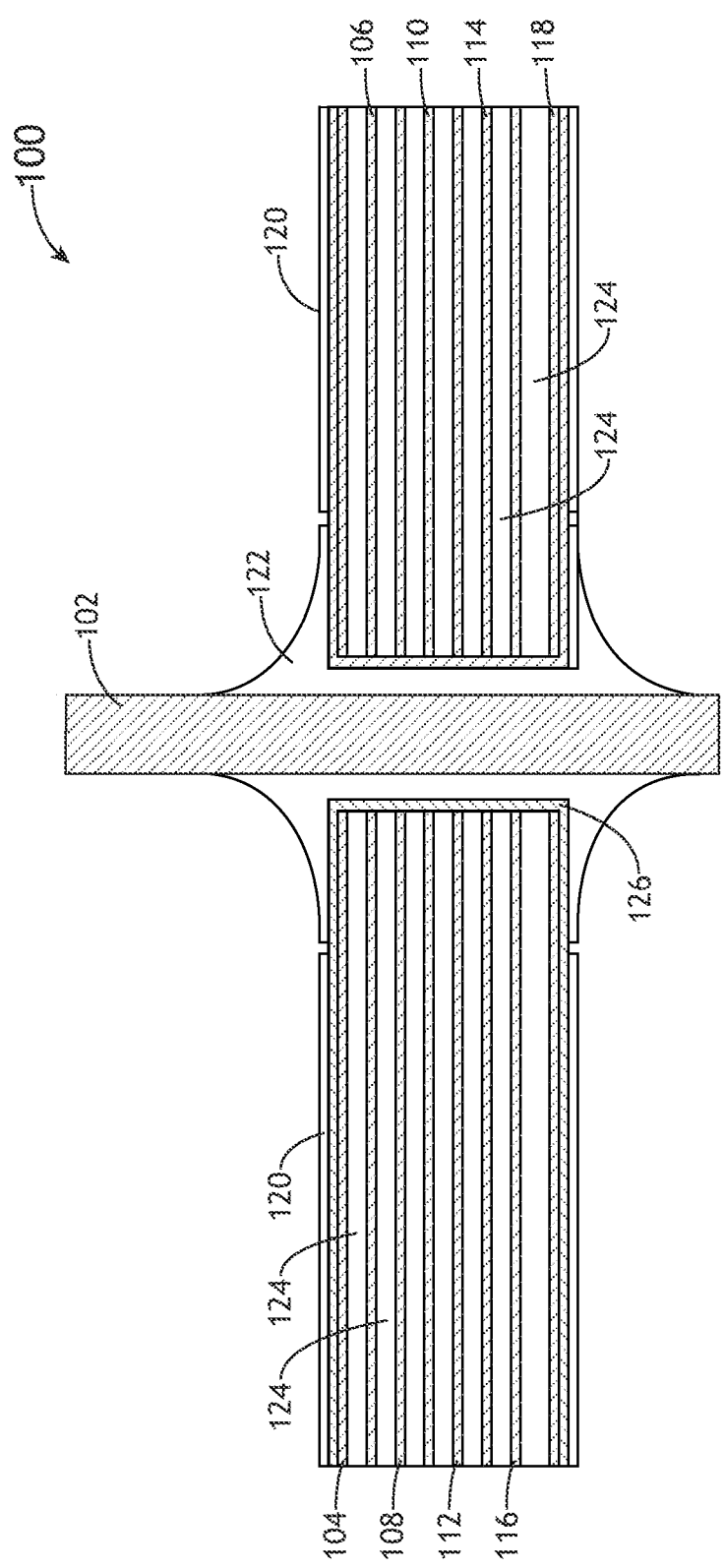
FIG. 1 shows a side, cross-sectional view of a state-of-the-art circuit card.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system of circuit card components with through-hole connections for soldering having recessed copper layers to thermal insulation.

Referring to FIG. 1, cross-sectional view of a state-of-the-art circuit card 100 is shown. During the soldering process, a solder mask 120 is applied and molten solder 122 flows along the surface of the through-hole pin 102 and solders to the barrel of the plated through-hole 126 connecting a plurality of conductive layers 104, 106, 108, 110, 112, 114, 116, 118 proximal to the through-hole pin 102. The conductive layers 104, 106, 108, 110, 112, 114, 116, 118, separated by a dielectric material 124, facilitate heat transfer away from the molten solder 122, causing it to cool. Often, such cooling causes the solder 122 to solidify before flowing all the way along the through-hole pin 102 creating a weak metallurgical bond to the plated through-hole barrel 126 connecting the conductive layers 104, 106, 108, 110, 112, 114, 116, 118.

Figure 2:
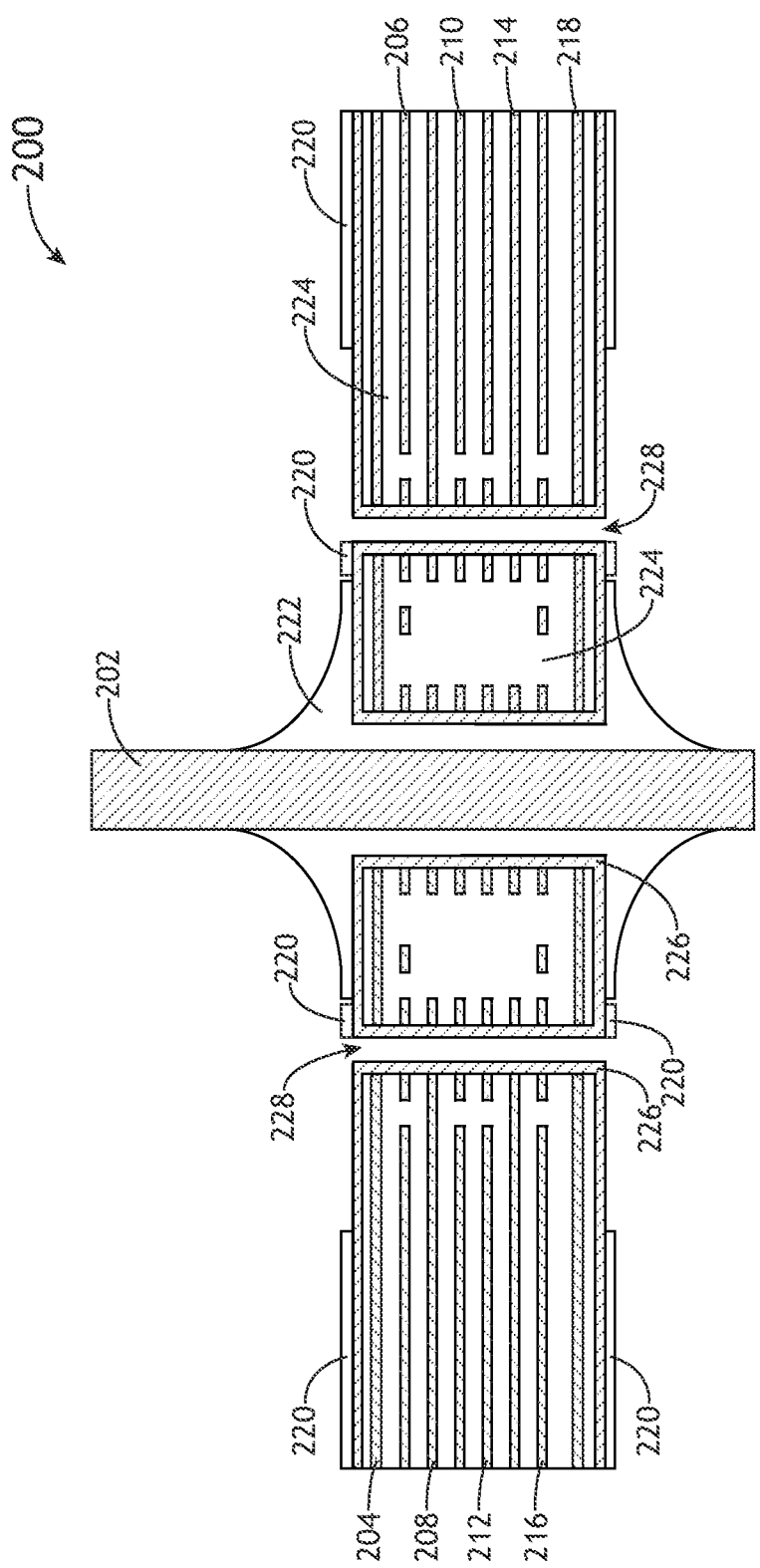
FIG. 2 shows a side, cross-sectional view of a circuit card according to an exemplary embodiment of the concepts disclosed herein.

Referring to FIG. 2, a side, cross-sectional view of a circuit card 200 according to an exemplary embodiment of the concepts disclosed herein is shown. The circuit card 200 comprises a through-hole pin 202 and a plurality of conductive layers 204, 206, 208, 210, 212, 214, 216, 218 separated by a dielectric 224. During soldering, a solder mask 220 is used to protect the exterior conductive layers 204, 218. Solder 222 is then applied to form a metallurgical bond between the through-hole pin 202 and the plated through-hole barrel 226 connecting to certain of the conductive layers 204, 206, 208, 210, 212, 214, 216, 218. It may be appreciated that in at least one embodiment, certain of the conductive layers 204, 206, 208, 210, 212, 214, 216, 218 may not have direct electrical connectivity to the through-hole pin 202 as more fully described herein.

The conductive circuit pattern of certain conductive layers 204, 206, 208, 210, 212, 214, 216, 218 are set back from the plated through-hole barrel 226 to prevent or reduce contact with the solder, preventing such heat conduction; for example all of the internal conductive layers 206, 208, 210, 212, 214, 216 (all conductive layers except for the top conductive layer 204 and bottom conductive layer 218) may define circuit patterns set back from the plated through-hole barrel 226. Setting the internal conductive layers 206, 208, 210, 212, 214, 216 may reduce electrical connectivity to the through-hole pin 202, which is traditionally required for power. In at least one embodiment, a plurality of vias 228 are disposed around the through-hole pin 202 to provide substantially the same cross-sectional area for electrical connectivity between the conductive layers 206, 208, 210, 212, 214, 216. For various reasons, ground plane portions 230 may be at different distances from the through-hole pin.

Figure 3:
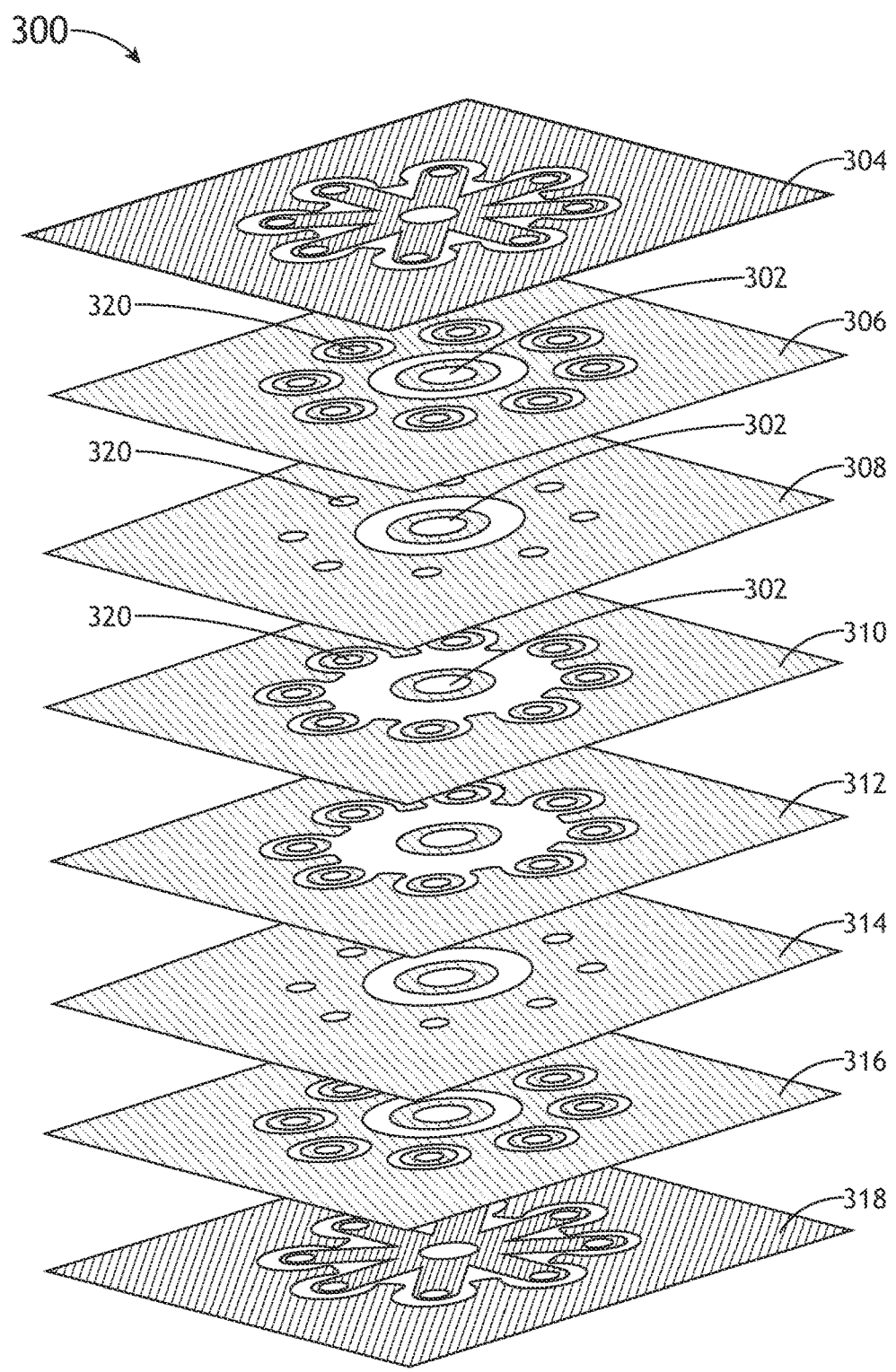
FIG. 3 shows an orthogonal, exploded view of a circuit card according to an exemplary embodiment of the concepts disclosed herein.

Referring to FIG. 3, an orthogonal, exploded view of a circuit card 300 according to an exemplary embodiment of the concepts disclosed herein is shown. The circuit card 300 comprises a plurality of conductive layers 304, 306, 308, 310, 312, 314, 316. The conductive layers 304, 306, 308, 310, 312, 314, 316, 318 each define a through-hole which may receive a through-hole pin 302. In at least one embodiment, the circuit card 300 comprises a top through-hole connection layer 304 and corresponding bottom through-hole connection layer 318; an upper outer ground layer 306 and lower outer ground layer 316; an upper parallel connection layer 308 and lower parallel connection layer 314; and an upper internal ground layer 310 and lower internal ground layer 312. In at least one embodiment, the circuit card 300 also includes any number of internal layers between the upper internal ground layer 310 and lower internal ground layer 312. Alternatively, or in addition, the circuit card 300 includes any number of internal ground layers 310, 312.

In at least one embodiment, electrical connectivity only exists in the top through-hole connection layer 304 and bottom through-hole connection layer 318. Internal conductive layers 306, 308, 310, 312, 314, 316 may be electrically isolated from the central through-hole via a barrel 322 and through-hole pin 302. The internal conductive layers 306, 308, 310, 312, 314, 316 create a high thermal resistance from the barrel 322 of the through-hole pin 302 connection to the circuit card 300. Available paths for heat transfer away from the through-hole barrel 322 are thereby minimized. Internal conductive layers 306, 308, 310, 312, 314, 316 may have additional clearance from the through-hole pin 302 to provide increased thermal resistance.

In at least one embodiment, ground layers 306, 316 include the only internal copper features that approach the through-hole pin 302. Such ground layers 306, 316 provide a path for return current while maintaining a low inductance connection and minimizing the electrical loop area. Such return path may facilitate a reduced risk of EMI qualification failures.

A circuit card 300 according to the present disclosure improves solderability by insulating the through-hole such that heat transfer to the through-hole pin 302 is maximized while heat transfer to the adjacent internal conductive layers 306, 308, 310, 312, 314, 316 is minimized. The insulation restricts and guides heat flow during soldering to the areas of the via structure where the heat is needed to provide more efficient heat transfer and improved soldering performance of the through-hole pin 302.

In at least one embodiment, vias 320 are placed around the circumference of the through-hole pin 302 to connect additional internal conductive layers 306, 308, 310, 312, 314, 316 without connecting directly to the central through-hole plated barrel 322 on inner layers. The vias 320 provide paths to other conductive layers 304, 306, 308, 310, 312, 314, 316, 318 for reduced impedance of parallel copper shapes or planes allowing for improved electrical performance. Vias 320 may be buried, blind, microvia, etc.

Figure 4:
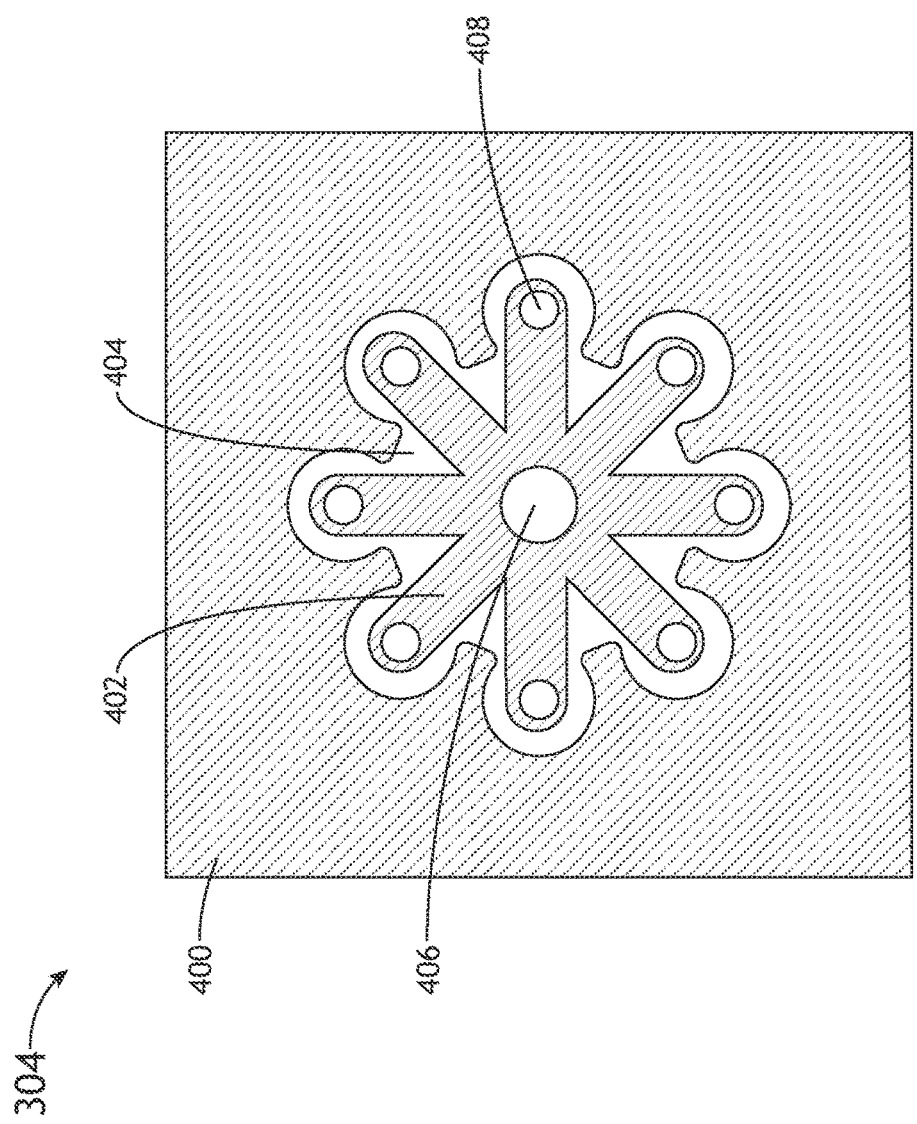
FIG. 4 shows a top view of a circuit card layer according to an exemplary embodiment of the concepts disclosed herein.

Referring to FIG. 4, a top view of a top circuit card layer 304 (also applicable to a bottom circuit card layer 318 in FIG. 3) according to an exemplary embodiment of the concepts disclosed herein is shown. The top circuit card layer 304 includes a conductive layer 400 disposed on a non-conductive substrate. The top circuit card layer 400 defines a through-hole 406 for receiving a through-hole pin.

In at least one embodiment, a setback region 404 separates the through-hole from the conductive layer 400. In at least one embodiment, the setback region 404 may be approximately thirty thousandths of an inch (~40 mil) or 0.76 millimeters. The top circuit card layer 304 can contact a soldering iron directly for conduction.

In at least one embodiment, the top circuit card layer 304 defines a plurality of via through-holes 408 disposed around the through-hole for receiving a corresponding via fill material. The vias provide electrical connectivity to other layers in the circuit card and allow layers to be placed in parallel.

In at least one embodiment, a cross-pattern of traces 402 connect the vias to the through-hole pin. Such traces 402 may provide the only connection from the through-hole pin to conductive layers of other layers in the circuit card by way of the vias.

The setback region 404 allows soldering iron heat to be applied directly to the top circuit card layer 304. The cross-pattern traces 402 to vias minimizes heat transfer away from the through-hole 406.

In at least one embodiment, the bottom circuit card layer (318 in FIG. 3) is substantially identical to a top circuit card layer 304. However, it may be appreciated that differences are envisioned; for example, the setback region may be approximately thirty thousandths of an inch (~30 mil) or 0.76 millimeters, and may contact a soldering iron directly for conduction.

Figure 5:
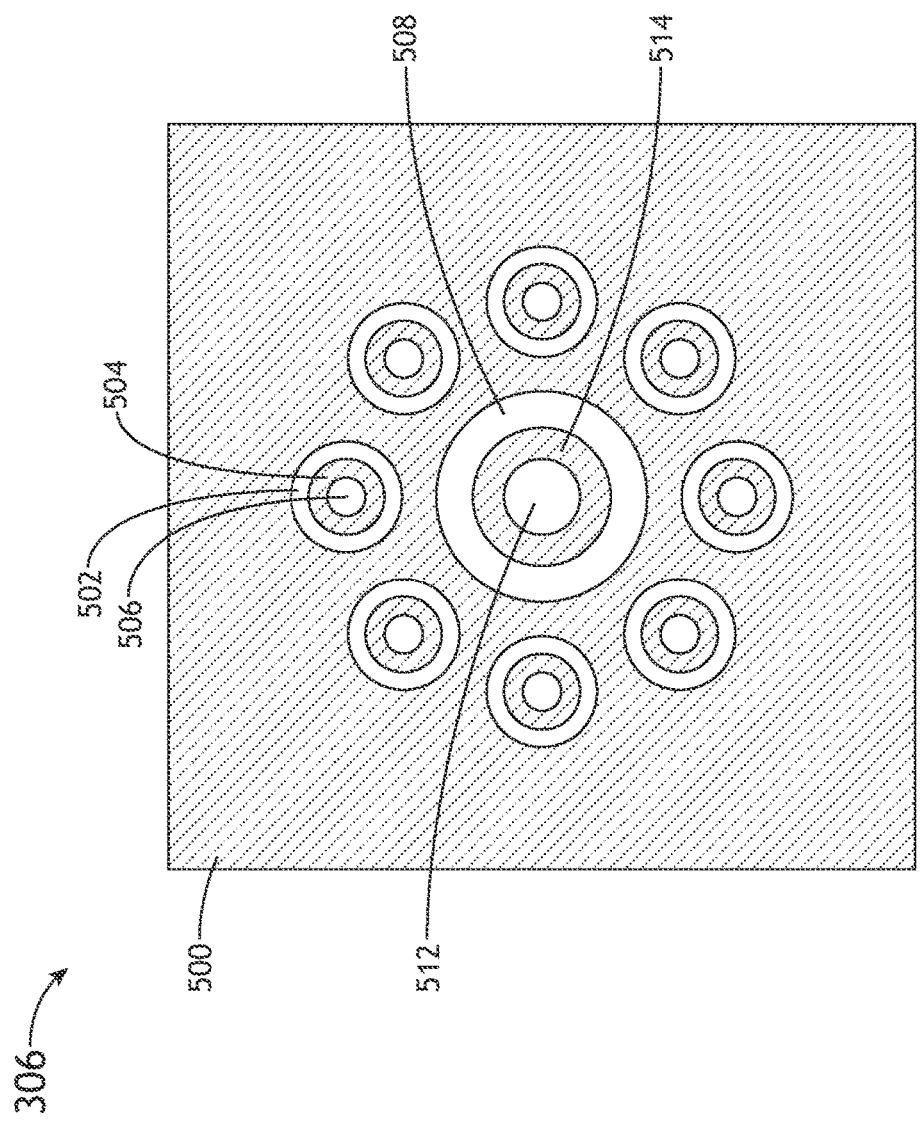
FIG. 5 shows a top view of a circuit card layer according to an exemplary embodiment of the concepts disclosed herein.

Referring to FIG. 5, a top view of a circuit card ground layer 306 (also 316 in FIG. 3) according to an exemplary embodiment of the concepts disclosed herein is shown. The circuit card ground layer 306 includes a conductive layer 500 disposed on a non-conductive substrate. The circuit card ground layer 306 defines a through-hole 512 for receiving a through-hole pin. A setback region 508 separates the through-hole 512 from the conductive layer 500. In at least one embodiment, a through-hole barrel 510 may line the through-hole 512.

In at least one embodiment, the setback region 508 is less than similar setback regions of other layers; that is to say, the conductive layer 500 of the circuit card ground layer 306 is closer to the through-hole 512 than any other layer in the circuit card. The small setback region 508 in the circuit card ground layer 306 maintains low inductance and a very small electrical loop area for high frequency currents, which may facilitate a reduced risk of EMI qualification failures. In at least one embodiment, the through-hole 512 is plated with a through-hole barrel 514.

In at least one embodiment, the circuit card ground layer 306 defines a plurality of via through-holes 506 disposed around the through-hole 512 for receiving a corresponding via filler material. The vias provide electrical connectivity to other layers in the circuit card and allow layers to be placed in parallel. In at least one embodiment, the via through-holes 506 are plated with a via barrel 504. In at least one embodiment, the conductive layer 500 defines a via set back region 502 from each via.

In at least one embodiment, the circuit card includes an upper circuit card ground layer 306 directly beneath a top circuit card layer and a lower circuit card ground layer (316 in FIG. 3) directly above a bottom circuit card layer.

Figure 6:
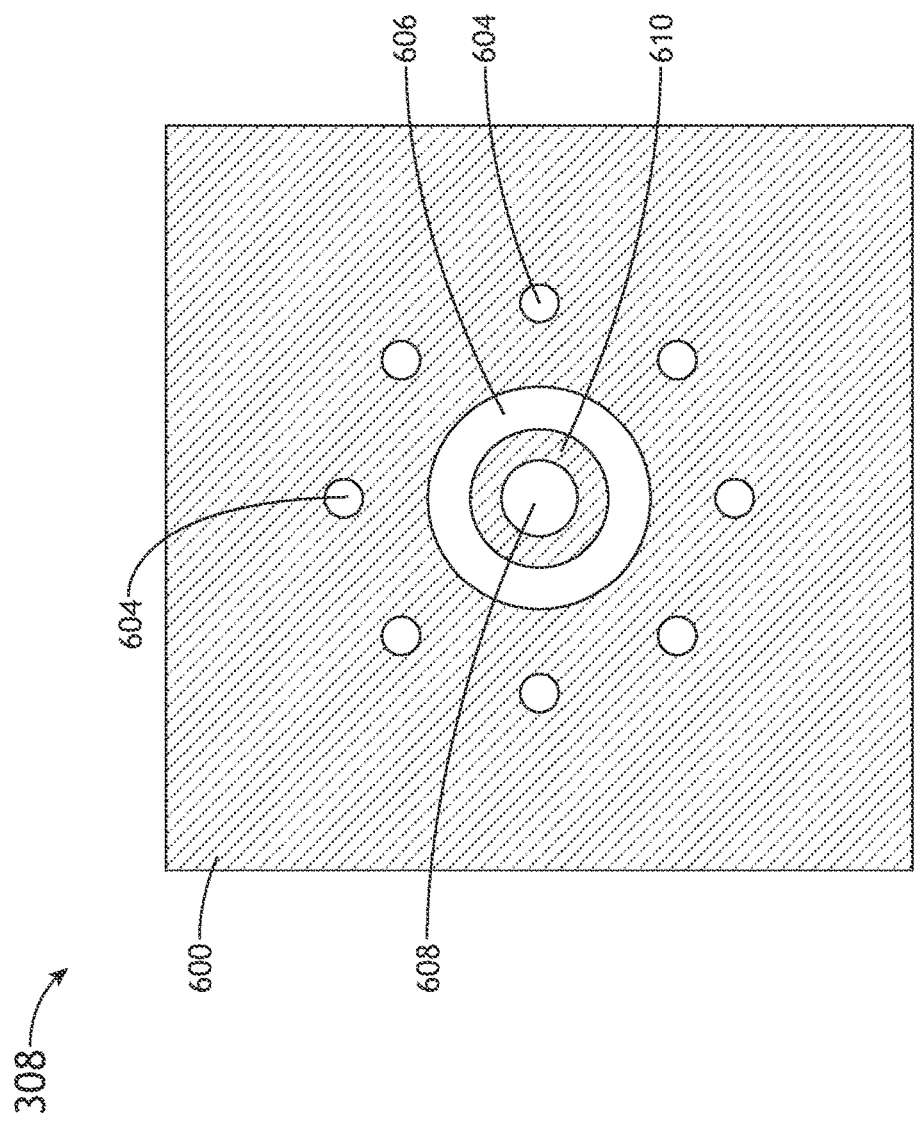
FIG. 6 shows a top view of a circuit card layer according to an exemplary embodiment of the concepts disclosed herein.

Referring to FIG. 6, a top view of a circuit card inner power plane layer 308 (also 314 in FIG. 3) according to an exemplary embodiment of the concepts disclosed herein is shown. The inner power plane layer 308 includes a conductive layer 600 disposed on a non-conductive substrate. The inner power plane layer 308 defines a through-hole 608 for receiving a through-hole pin. A setback region 606 separates the through-hole 608 from the conductive layer 600. In at least one embodiment, a through-hole barrel 610 may line the through-hole 608.

In at least one embodiment, the inner power plane layer 308 defines a plurality of via through-holes 604 disposed around the through-hole 608 for receiving a corresponding via filler material. The vias provide electrical connectivity to other layers in the circuit card and allow layers to be placed in parallel. In at least one embodiment, the setback region 606 completely isolates the through-hole 610 from the conductive layer 600 such that the circuit card inner power plane layer 308 only connects to the vias. The setback region 606 provides increased thermal resistance to the through-hole 608. The conductive layer 600 and vias provide for low electrical impedance.

In at least one embodiment, the circuit card includes an upper inner power plane layer 308 directly beneath an upper circuit card ground layer and a lower inner power plane layer (314 in FIG. 3) directly above a lower circuit card ground layer.

In at least one embodiment, the circuit card includes any number of internal power layers disposed between an upper circuit card ground layer and a lower circuit card ground layer.

Figure 7:
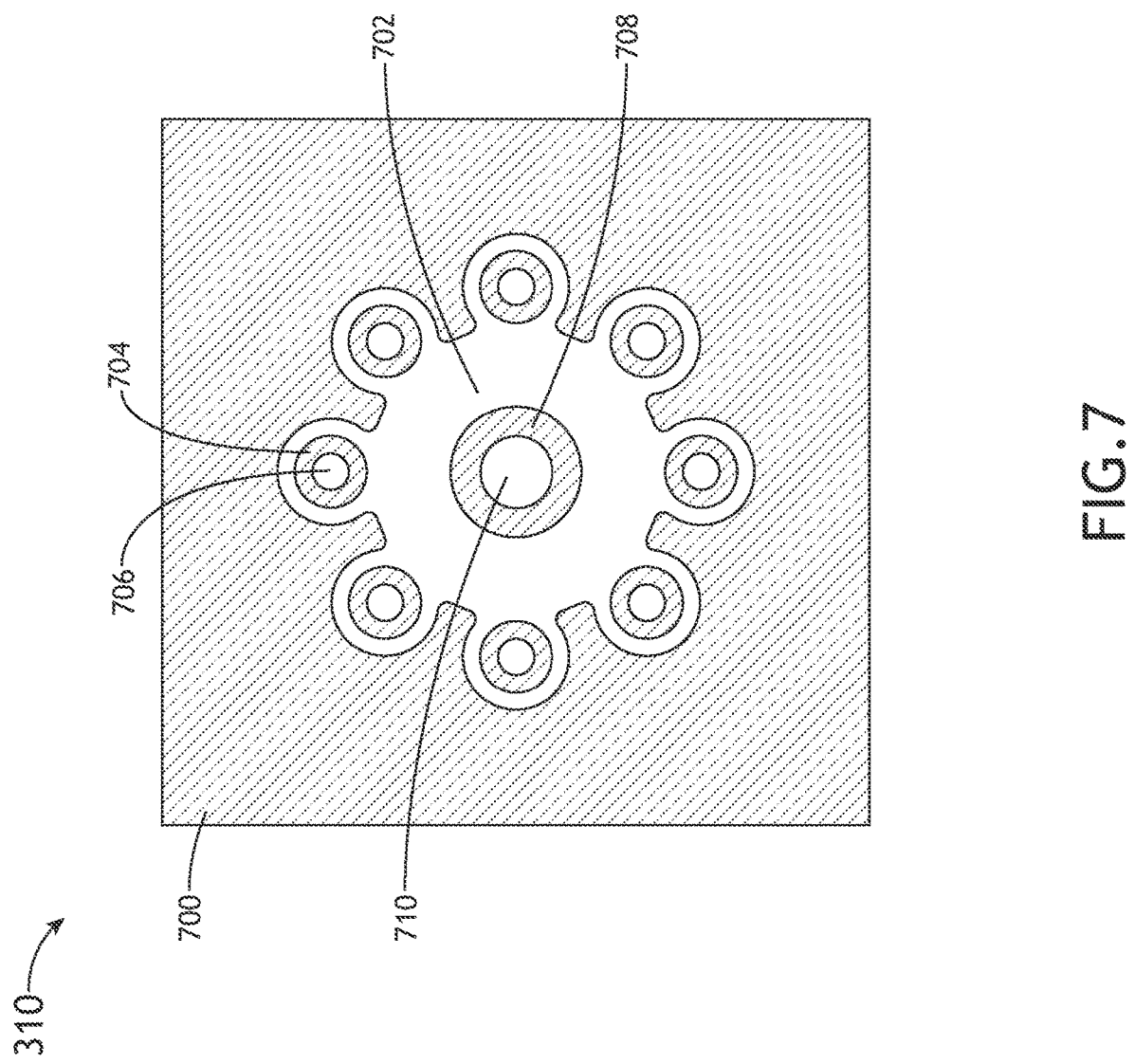
FIG. 7 shows a top view of a circuit card layer according to an exemplary embodiment of the concepts disclosed herein.

Referring to FIG. 7, a top view of a circuit card internal ground layer 310 (also 312 in FIG. 3) according to an exemplary embodiment of the concepts disclosed herein is shown. The internal ground layer 310 includes a conductive layer 700 disposed on a non-conductive substrate. The internal ground layer 310 defines a through-hole 710 for receiving a through-hole pin. A setback region 702 separates the through-hole 710 from the conductive layer 700. In at least one embodiment, a through-hole barrel 708 may line the through-hole 710.

In at least one embodiment, the internal ground layer 310 defines a plurality of via through-holes 706 disposed around the through-hole 710 for receiving a corresponding via filler material. The vias provide electrical connectivity to other layers in the circuit card and allow layers to be placed in parallel. In at least one embodiment, the setback region 702 extends to the edge of the vias. The setback region 702 maximizes thermal resistance to the through-hole pin while allowing electrical connectivity to the vias. In at least one embodiment, the via through-holes 706 are plated with a via barrel 704.

In at least one embodiment, the circuit card includes any number of internal ground layers 310 disposed between an upper circuit card ground layer and a lower circuit card ground layer.

Figure 8:
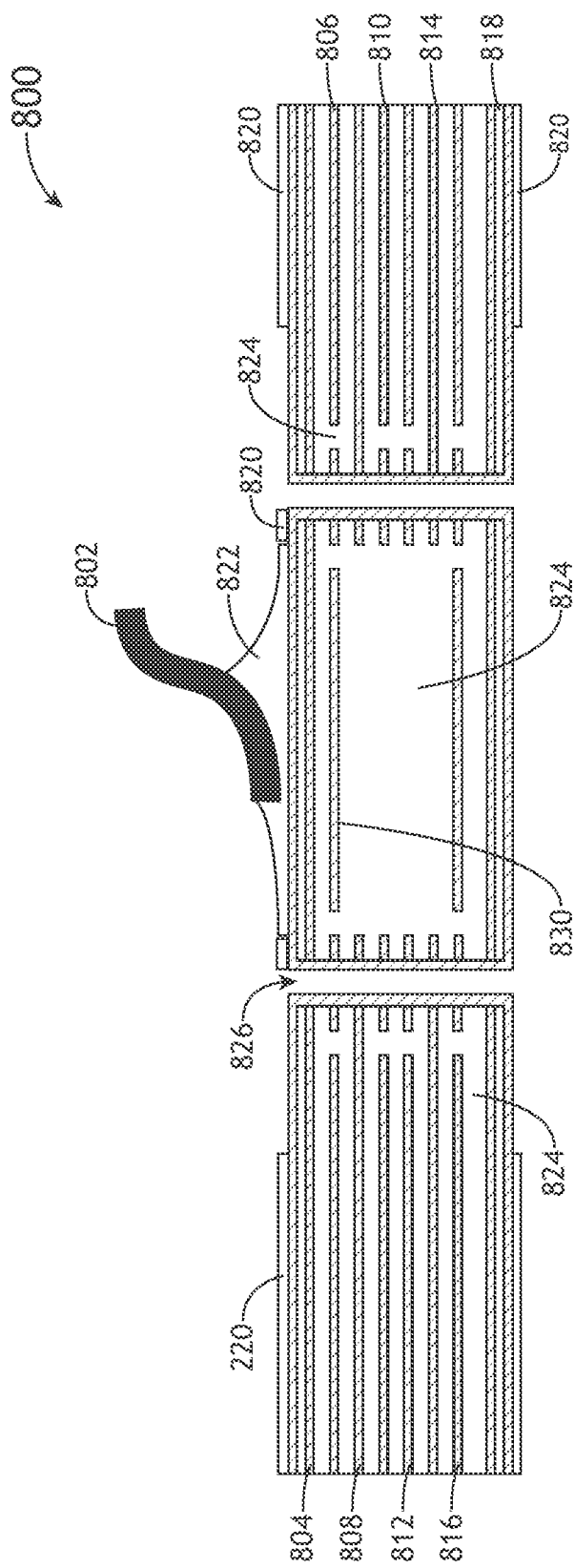
FIG. 8 shows a side, cross-sectional view of a circuit card according to an exemplary embodiment of the concepts disclosed herein.

Referring to FIG. 8, a side, cross-sectional view of a circuit card 800 according to an exemplary embodiment of the concepts disclosed herein is shown. The circuit card 800 comprises a surface mounted connector 802 and a plurality of conductive layers 804, 806, 808, 810, 812, 814, 816, 818 separated by a dielectric 824. During soldering, a solder mask 820 is used to protect the exterior conductive layers 804, 818. Solder 822 is then applied to form a metallurgical bond between the surface mounted connector 802 and top circuit card layer 804.

The conductive circuit pattern of certain conductive layers 804, 806, 808, 810, 812, 814, 816, 818 are set back from any solder proximal regions; for example all of the internal conductive layers 806, 808, 810, 812, 814, 816 (all conductive layers except for the top conductive layer 804 and bottom conductive layer 818) may define circuit patterns set back from the solder proximal regions. Setting back the internal conductive layers 806, 808, 810, 812, 814, 816 may reduce electrical connectivity to the through-hole pin 802, which is traditionally required for power. In at least one embodiment, a plurality of vias 826 are disposed around the surface mounted connector 802 to provide substantially the same cross-sectional area for electrical connectivity between the conductive layers 806, 808, 810, 812, 814, 816. For various reasons, ground plane portions 830 may be at different distances from the through-hole pin.

Circuit card production processes utilizing embodiments of the present disclosure may produce less scrap and may be easier to rework. Such embodiments allow for improved solder fill, and therefore higher quality circuit cards. The inventive concepts disclosed herein may be extended to other circuit card assemblies with similar through-hole component terminations. Furthermore, embodiments of the present disclosure may utilize lead free solder as may be mandated by environmental regulations.

It may be appreciated that circuit card elements not specifically discussed are envisioned. For example, circuit cards with signal layers having a conductive layer setback may be included. Circuit traces for signals may reside on layers between ground and power planes.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A circuit card layer comprising:
   a non-conductive core; and
   a conductive layer disposed on the non-conductive core, wherein:
      the circuit card layer comprises internal ground plane portions defining a return path;
      the circuit card layer defines a surface mount proximal region;
      the circuit card layer defines a plurality of vias disposed regularly around the surface mount proximal region;
      the circuit card layer defines a cross-pattern of traces connecting the plurality of vias and the surface mount proximal region; and
      the conductive layer is set back from the cross-pattern of traces to reduce thermal conduction from a surface mounted connector to the conductive layer during a soldering operation.

2. The circuit card layer of claim 1, wherein the conductive layer is set back at least twenty thousandths of an inch (20 mil) from the surface mount proximal region.

3. The circuit card layer of claim 1, wherein the circuit card layer comprises a coplanar connection layer of a circuit card.

4. A circuit card comprising:
   a plurality of circuit card layers, each of the plurality of circuit card layers comprising:
      a non-conductive core; and
      a conductive layer disposed on the non-conductive core; and
   a plurality of vias, each of the plurality of vias intersecting each of the plurality of circuit card layers in a corresponding conductive layer,
   wherein:
      each of the plurality of circuit card layers defines a through-hole configured for receiving a through-hole pin;
      each conductive layer is set back from the corresponding through-hole to insulate a through-hole pin during a soldering operation;
      the plurality of vias are disposed regularly around the through-hole;
      at least one of the plurality of circuit card layers comprises an internal ground plane layer defining a return path, the conductive layer of the internal ground plane layer is set back from the corresponding through-hole and from each of the plurality of vias, in a single contiguous region; and
      at least one of the plurality of circuit card layers comprises a top through-hole connection layer disposed at a top surface of the circuit card, the top through-hole connection layer comprising a cross-pattern of traces connecting the top through-hole connection layer to the plurality of vias, the conductive layer of the top through-hole layer being setback from the cross-pattern of traces.

5. The circuit card of claim 4, wherein the through-hole hole is physically connected only to the conductive layer of the top through-hole connection layer.

6. The circuit card of claim 4, further comprising: a bottom through-hole connection layer disposed at a bottom surface of the circuit card, wherein the bottom through-hole connection layer comprises a plurality of traces connecting the bottom through-hole connection layer to the plurality of vias.

7. The circuit card of claim 6, wherein the through-hole hole is electrically connected only to the conductive layers of the top through-hole connection layer and the bottom through-hole connection layer.

8. The circuit card of claim 4, wherein:
   a first circuit card layer in the plurality of circuit card layers comprises an upper outer ground layer; and
   a second circuit card layer in the plurality of circuit card layers comprises a lower outer ground layer.

9. The circuit card of claim 4, wherein:
   a first circuit card layer in the plurality of circuit card layers comprises an upper coplanar connection layer; and a second circuit card layer in the plurality of circuit card layers comprises a lower coplanar connection layer.

* * * * *